United States Patent
Cox et al.

[19]

[11] Patent Number: 6,063,197
[45] Date of Patent: May 16, 2000

[54] TRAP FOR CAPTURING WASTE BY-PRODUCT GENERATED BY A CHEMICAL VAPOR DEPOSITION SYSTEM

[75] Inventors: Arthur Leo Cox, Buda; Stephen Craig Bigley, Austin, both of Tex.

[73] Assignee: Advanced Micro Devices, Inc., Sunnyvale, Calif.

[21] Appl. No.: 08/939,846

[22] Filed: Sep. 29, 1997

[51] Int. Cl.[7] ..................................................... B01D 8/00
[52] U.S. Cl. ............................ 118/715; 34/72; 55/434.2; 62/642
[58] Field of Search .................. 118/715, 50; 34/72; 95/273; 62/642; 55/434, 434.2, 434.3, 434.4; 261/156

[56] References Cited

U.S. PATENT DOCUMENTS

| | | | |
|---|---|---|---|
| 2,728,632 | 12/1955 | Matheson | 62/55.5 |
| 3,785,162 | 1/1974 | Long et al. | 62/55.5 |
| 5,488,833 | 2/1996 | Stewart | 62/55.5 |
| 5,556,473 | 9/1996 | Olson et al. | 118/715 |
| 5,607,511 | 3/1997 | Meyerson | 118/715 |
| 5,626,651 | 5/1997 | Dullien | 95/214 |

FOREIGN PATENT DOCUMENTS

| | | | |
|---|---|---|---|
| 2025573 | 1/1990 | Japan | 118/715 |

OTHER PUBLICATIONS

"Precision 5000 CVD: Systems Manual Part 5000–10–01," Section 3, p.1–6, 29–30 and 34–35, Section 6, p. 3, *Applied Materials,* Copyright 1987.

*Primary Examiner*—Jan H. Silbaugh
*Assistant Examiner*—Dae Young Lee
*Attorney, Agent, or Firm*—Conley, Rose & Tayon, P.C.; Kevin L. Daffer

[57] ABSTRACT

A chemical vapor deposition system including a chemical vapor deposition chamber, an inlet line for directing reactant gases into the deposition chamber, and outlet line for discharging waste by-product from the deposition chamber, and a detachable trap position along the outlet line for trapping at least a portion of the waste by-product. The trap can include an array of baffles for increasing the surface area within the trap and disrupting flow within the trap. The trap can also include cooling structure for cooling at least a portion of the trap to enhance waste by-product deposition within the trap.

21 Claims, 6 Drawing Sheets

TRAP FOR CAPTURING WASTE BY-PRODUCT GENERATED BY A CHEMICAL VAPOR DEPOSITION SYSTEM

FIELD OF THE INVENTION

The present invention relates generally to chemical vapor deposition systems. More particularly, the present invention relates to apparatuses and methods for reducing the accumulation of waste-by-product within outlet or exhaust vacuum lines of chemical vapor deposition systems.

BACKGROUND OF THE INVENTION

Chemical vapor deposition systems are commonly used to deposit films on wafers destined for use in the computer industry. Chemical vapor deposition systems are typically equipped with the following components: (1) a chemical vapor deposition chamber; (2) gas sources; (3) inlet lines for feeding gas from the gas sources into the deposition chamber; (4) a mechanism for heating the wafers on which the film is to be deposited; (5) an outlet line; and (6) a vacuum source for evacuating waste by-products from the deposition chamber through the outlet line.

A problem associated with existing chemical vapor deposition systems relates to the accumulation of waste by-product within the outlet or exhaust vacuum lines. Specifically, as exhaust gas from a deposition chamber travels through an outlet vacuum line, waste by-product such as silicon dust and other materials become deposited on the inner surface of the outlet vacuum line. The gradual accumulation of waste byproduct within the outlet vacuum line results in the partial or total occlusion of the outlet vacuum line. As a result, at regular intervals, such outlet vacuum lines are required to be disassembled and cleaned. Typically, the accumulation is removed from the outlet vacuum line by soaking the line in de-ionized water and alcohol to dissolve the accumulated material within the line. Depending upon the severity of the accumulation and the length of the outlet line, the cleansing process can often takes from two to three days.

SUMMARY OF THE INVENTION

One aspect of the present invention relates to a chemical vapor deposition system including a chemical vapor deposition chamber, an inlet line for directing reactant gases into the deposition chamber, and an outlet line for discharging waste byproduct from the deposition chamber. The system also includes a detachable trap positioned along the outlet line for trapping at least a portion of the waste by-product. The detachable trap can include an array of baffles for increasing the surface area within the trap and disrupting flow within the trap. The detachable trap can also include cooling structure constructed and arranged to cool at least a portion of the trap to enhance waste by-product deposition within the trap.

Another aspect of the present invention relates to a method for reducing waste product buildup in an outlet line of a chemical vapor deposition chamber. The method includes the step of providing a trap including a plurality of baffles for disrupting flow within the trap. The method also includes the step of detachably mounting the trap along the outlet line at a location adjacent to the chemical vapor deposition chamber. The method further includes the step of cooling at least a portion of the trap to enhance waste by-product deposition within the trap.

The various aspects of the present invention provide methods and apparatuses for reducing the accumulation of waste by-product within an outlet vacuum line of a chemical vapor deposition chamber. By reducing buildup within the outlet line, operating efficiency is improved and delays associated with outlet line cleanups are reduced. A variety of additional advantages of the invention will be set forth in part in the description which follows, and in part will be apparent from the description, or maybe learned by practicing the invention. It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several aspects of the invention and together with the description, serve to explain the principles of the invention. A brief description of the drawings is as follows.

DETAILED DESCRIPTION

Reference will now be made in detail to the exemplary aspects of the present invention which are illustrated in the accompanying drawings. Wherever possible, the same reference numbers will be used throughout the drawings to refer to the same or like parts.

Figure 1:
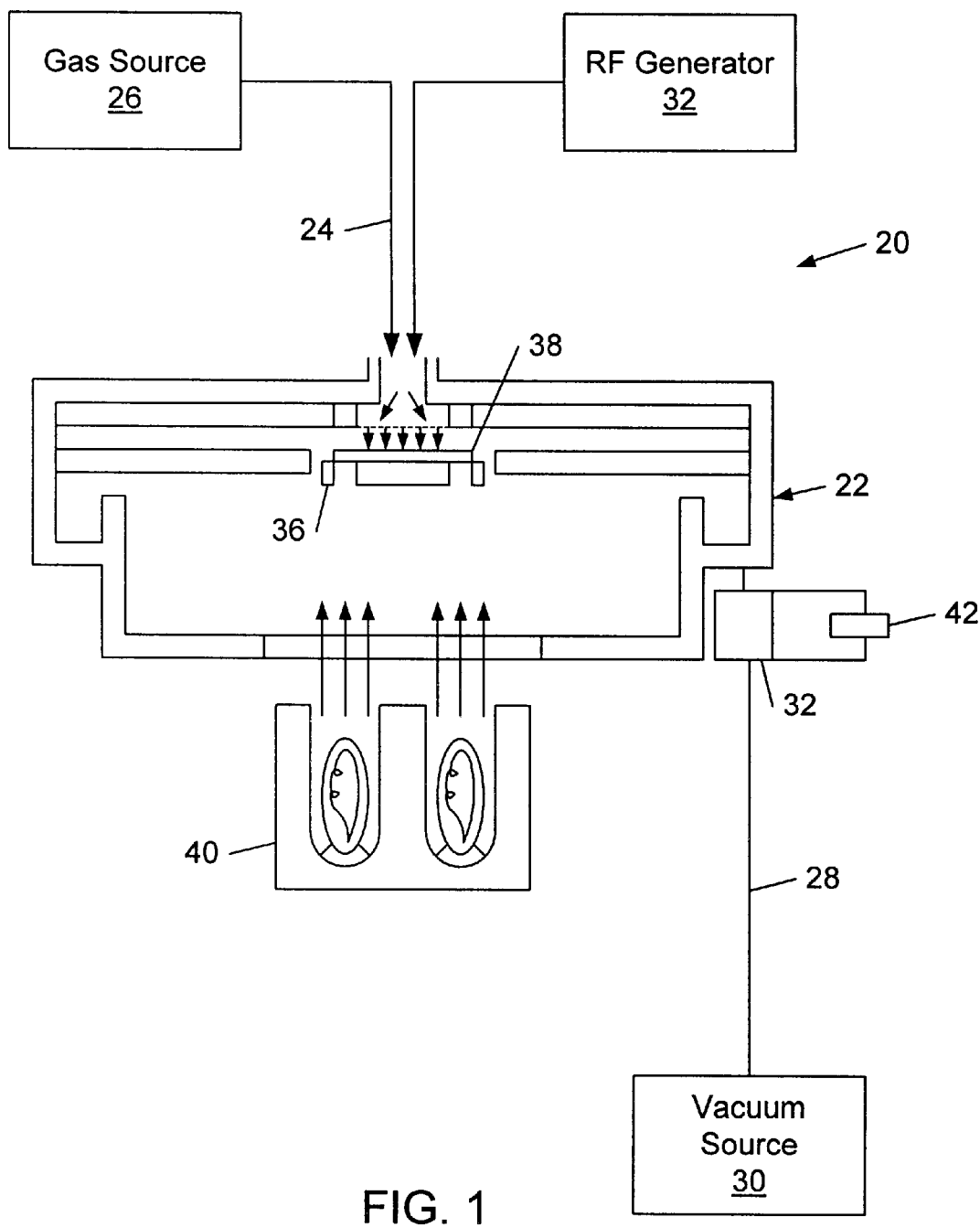
FIG. 1 is a schematic diagram of the chemical vapor deposition system constructed in accordance with the principles of the present invention.

FIG. 1 is a schematic diagram illustrating a chemical vapor deposition system 20 constructed in accordance with the principles of the present invention. The system 20 includes a chemical vapor deposition chamber 22, an inlet conduit or line 24 for directing reactant gases from a gas source 26 into the deposition chamber 22, and an outlet conduit or line 28 for exhausting waste by-product from the deposition chamber 22. The outlet line 28 is in fluid communication with a remote vacuum source 30 adapted to provide suction for evacuating waste by-product from the deposition chamber 22. The system also includes a detachable trap 32 positioned along the outlet line 28 at a location directly adjacent to the chamber 22. The trap 32 is arranged and configured to trap at least a portion of the waste by-product evacuated from the chamber 22 so as to prevent such by-product from accumulating within the outlet line 28.

The chemical vapor deposition system 20 of FIG. 1 is a plasma enhanced chemical vapor deposition system which uses an rf-induced glow discharge generated by an rf generator 34 to transfer energy into the reactant gases provided by the gas source 26. The chamber 22 includes a susceptor 36 configured for supporting a wafer 38 during the deposition process. Thermal energy for heating the chamber 22 is provided by a thermal energy source 40 such as a lamp module or other type of resistance or radiant heater. While FIG. 1 depicts a specific plasma enhanced vapor deposition chamber arrangement, those skilled in the art will recognize that the present invention can be used with any type of known chemical vapor deposition reactor design. Consequently, the chamber 22 is strictly exemplary and is not intended to be construed as a limitation upon the present invention.

The chemical vapor deposition system 20 can be used to deposit a variety of films on the wafer 38. Exemplary films include TEOS oxide, silane nitride, silane oxide, oxi nitride, and sputter etch. To generate the previously identified films, a variety of reactant and carrier gases can be provided by the gas source 26. Exemplary gases include $O_3$, TEOS, $C_2F_8$, $O_2$, $NF_3$, $SiH_4$, $NH_3$, $N_2$, $N_2O$, $PH_3$, NFS, $OF_4$, and Ar. During the deposition process, the wafer 38 is typically heated to temperatures of about 400° C.

As indicated above, the trap 32 of the system 20 functions to remove waste by-product from exhaust fluid that is evacuated from the deposition chamber 22. The trap 32 can include an array of baffles or fins for disrupting flow within the trap 32 and increasing surface area within the trap. The trap 32 can also use a cooling structure to cool at least a portion of the trap 32 such that waste by-product deposition is enhanced. For example, a source of cooling fluid 42 can be used to provide fluid adapted for cooling at least a portion of the trap 32. Because the trap 32 accumulates waste by-product such as silicon which is exhausted from the chamber 22, by-product accumulation is reduced in the remainder of the outlet line 28. As a result, the trap 32 reduces the frequency that the outlet line 28 is required to be cleaned.

Figure 2:
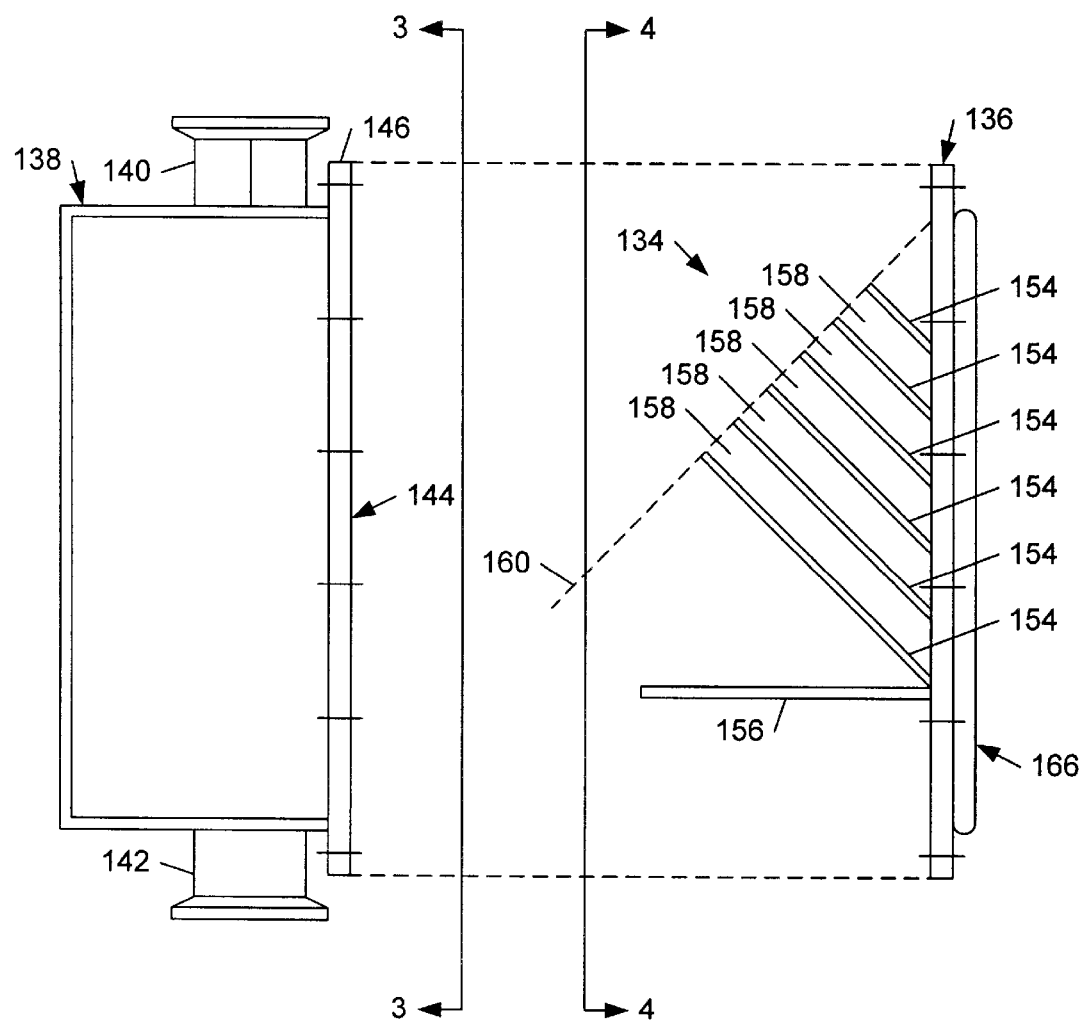
FIG. 2 is an exploded view of an exemplary trap constructed in accordance with the principles of the present invention.

FIG. 2 illustrates an exemplary trap 132 suitable for use in the system of FIG. 1. The trap 132 includes a plurality of baffles or fins 134 connected to a cooling plate 136. The trap 132 also includes a rectangular housing 138 adapted for covering the baffles 134. The housing 138 includes an inlet fitting 140 and an outlet fitting 142 adapted for fluidly connecting the trap 132 along an outlet line of a chemical vapor deposition system. It is desirable for the fittings 140 and 142 to be quick connect couplings for allowing the trap 132 to be quickly connected or disconnected to a vacuum line such as the outlet line 28 shown in FIG. 1. Exemplary quick connect couplings include KF40 standard vacuum fittings.

Figure 3:
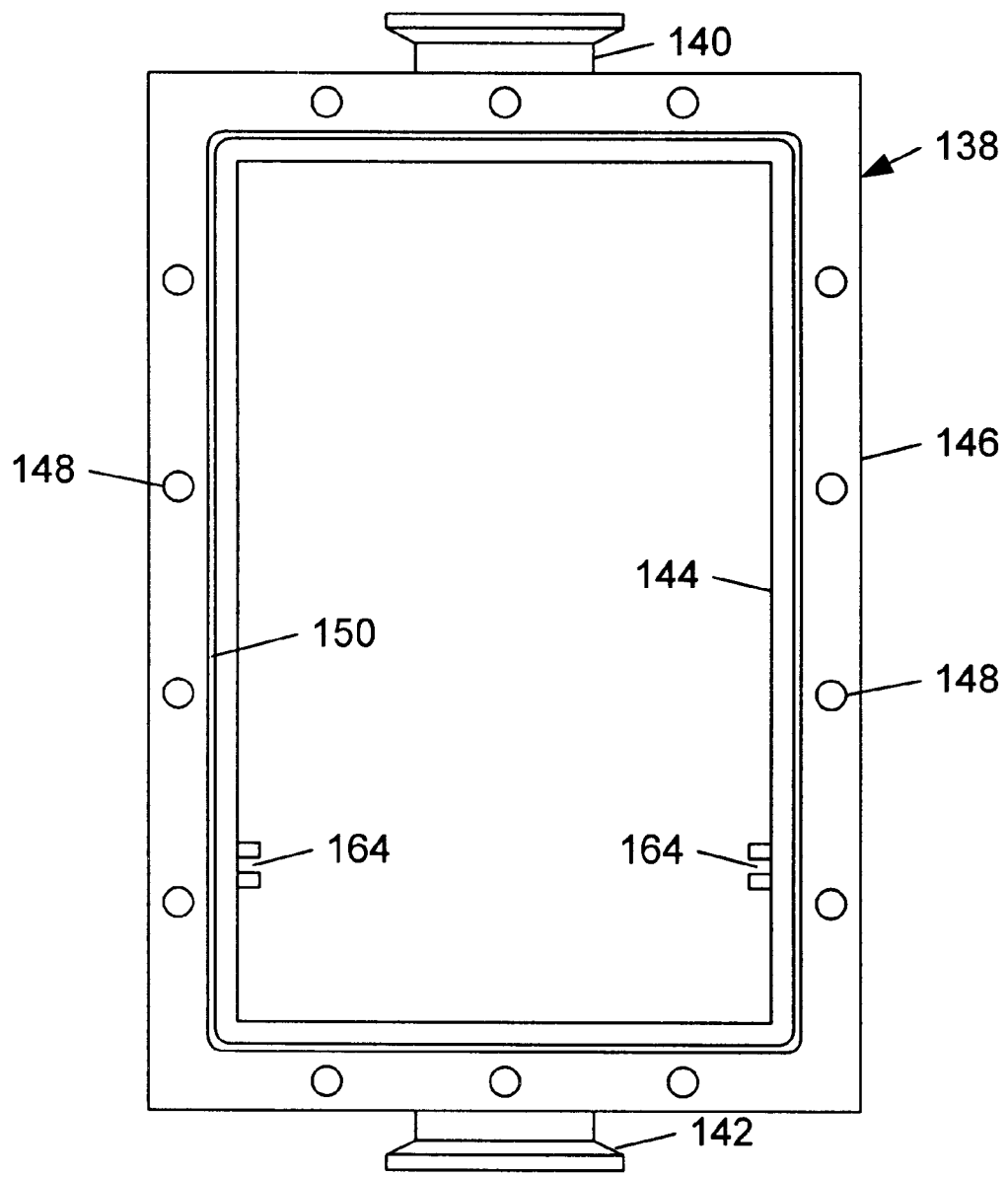
FIG. 3 is a cross-sectional view of FIG. 2 taken along section line 3—3.

Referring to FIGS. 2 and 3, the housing 138 of the trap 132 defines a generally rectangular open-ended trap chamber 144 sized for receiving the baffles 134. A peripheral connecting flange 146 projects transversely outward from the open end of the housing 138. The connecting flange 146 defines a plurality of openings 148 adapted for allowing the housing 138 to be bolted to the cooling plate 136. The connecting flange 146 also defines a groove sized for receiving a gasket 150 adapted for forming a fluid tight seal between the flange 146 and the cooling plate 136.

Figure 4:
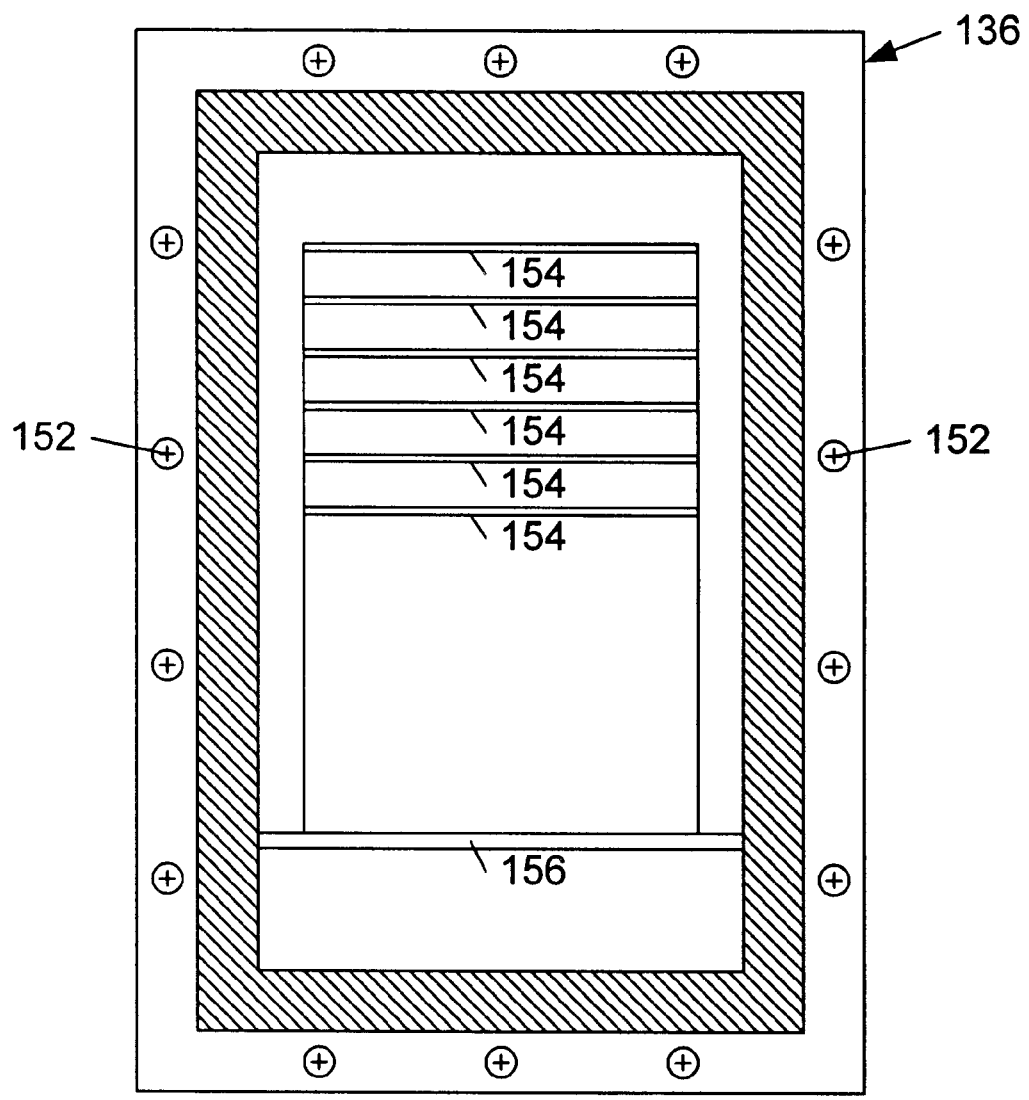
FIG. 4 is a cross-sectional view of FIG. 2 taken along section line 4—4.

Referring now to FIGS. 2 and 4, the cooling plate 136 is generally rectangular and defines a plurality of openings 152 configured to coaxially align with the openings 148 of the housing 138 such that the cooling plate 136 and the housing 138 can be bolted together. The baffles 134 of the cooling plate 136 are generally rectangular plates having fixed ends connected to the cooling plate 136 and free ends distally located from the cooling plate 136. The baffles 134 include a plurality of oblique fins 154 and a single transverse fin 156.

The oblique fins 154 of the cooling plate 136 are generally parallel and form oblique angles with respect to the cooling plate 136. Pockets 158 for accumulating waste by-product are formed between the oblique fins 154. The oblique fins 154 have variable length such that the free ends of the oblique fins 154 are aligned generally along a plane 160 that forms an oblique angle with respect to the cooling plate 136. Furthermore, the oblique fins 154 have widths that are less than the width of the trap chamber 144.

The transverse fin 156 is generally rectangular and substantially forms a right angle with respect to the cooling plate 136. The transverse fin 156 has substantially the same width as the width of the trap chamber 144. Furthermore, when the cooling plate 138 is connected to the housing 138, the transverse fin 156 is adapted to fit within opposing slots 164 defined within the trap chamber 144 of the housing 138. By securing the sides of the transverse fin 156 within the slots 164, fluid is prevented from flowing around the sides of the transverse fin 156.

Figure 5:
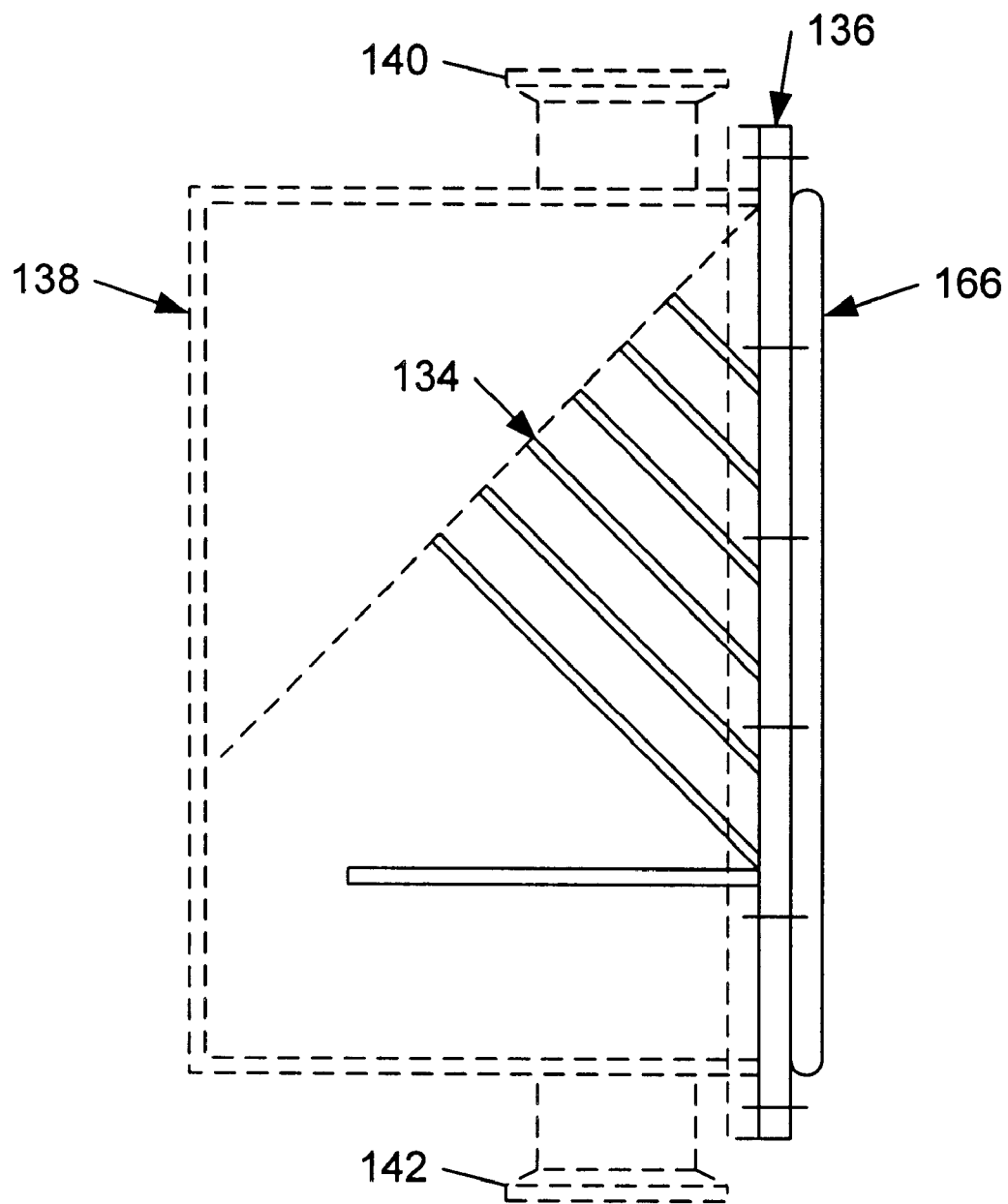
FIG. 5 is an assembled view of the trap of FIG. 2 with the trap cover shown in phantom line.

FIG. 5 shows the housing 138, in phantom line, connected to the cooling plate 136. It will be appreciated that the baffles 134 function to increase the surface area within the trap 132. Additionally, the baffles also function to disrupt fluid flow traveling within the trap 132 between the inlet fitting 140 and the outlet fitting 142. Furthermore, the pockets 158 defined by the baffles 134 function to accumulate waste by-product generated by a chemical vapor deposition system such as the one shown in FIG. 1.

Figure 6:
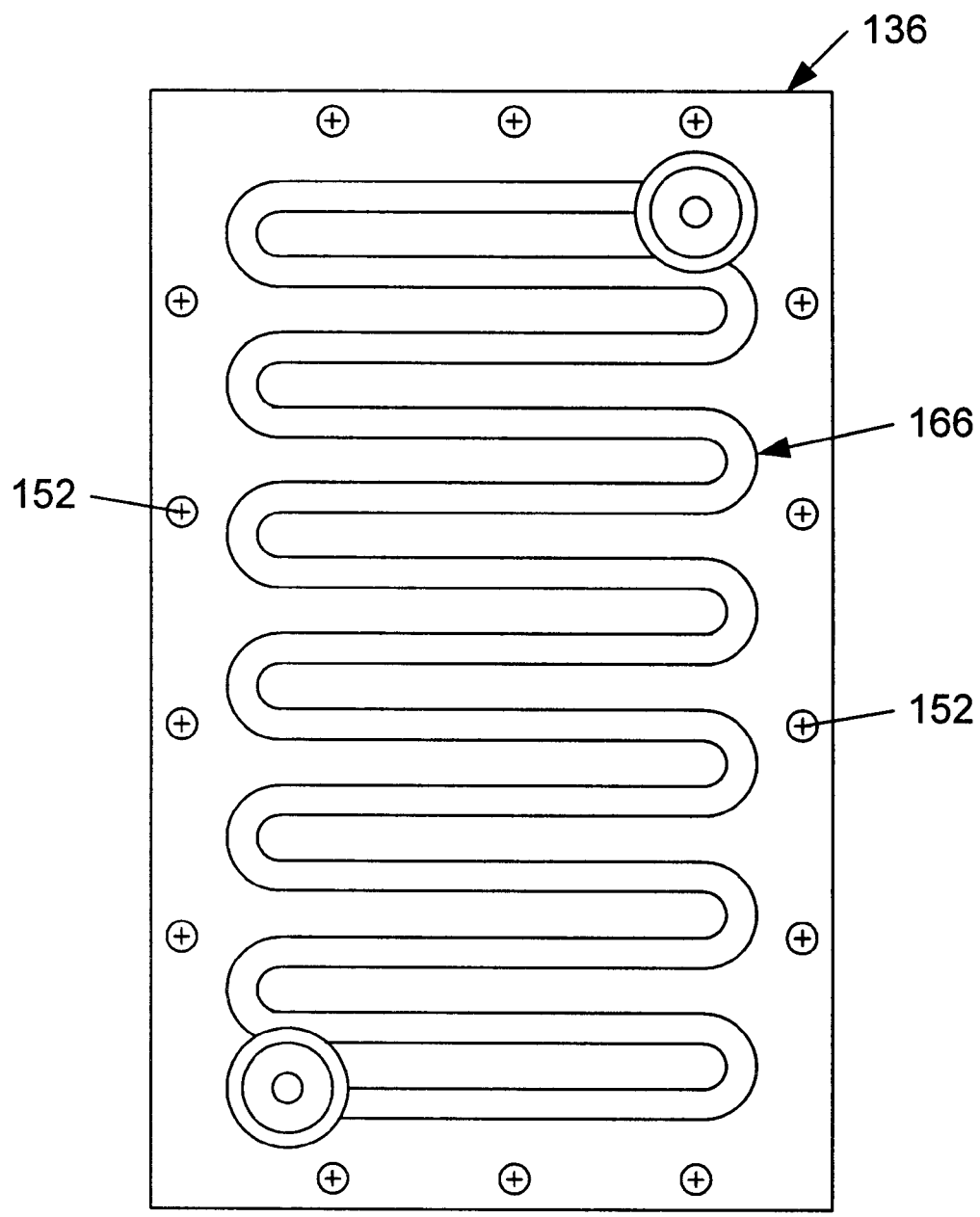
FIG. 6 is a right side view of the trap of FIG. 5, the side view illustrates a cooling system adapted for cooling the trap.

The cooling plate 136 of the trap 132 also includes structure for cooling at least a portion of the trap 132. As shown in FIGS. 2, 5, and 6, the cooling structure includes a tube 166 secured to the cooling plate 136. The tube 166 defines a convoluted pathway extending along the outer surface of the cooling plate 136. The ends of the tube 166 include fittings for allowing the tube 166 to be connected to a source of cooling fluid (not shown). In use, cooling fluid is circulated through the tube 166 to cool the cooling plate 136 and baffles 134. By cooling at least a portion of the trap 132, waste by-product deposition within the trap 132 is enhanced.

A variety of cooling fluids can be circulated through the tube 166. An exemplary cooling fluid is water. Although the cooling fluids may have varying temperatures, it is desirable for the cooling fluids to have temperatures below ambient temperature. In some embodiments, the cooling fluids may have temperatures less than 15° C.

It will be appreciated that the cooling structure depicted in FIGS. 1, 5 and 6 is strictly exemplary and is not intended to be construed as a limitation on the present invention. Alternative arrangements may also be used. For example, a fluid circulation path can be formed in the plate itself by boring a plurality of holes lengthwise and widthwise through the plate, and selectively plugging certain bore sites.

The trap housing and baffles can be made of a variety of materials. For example, the housing can be made of stainless steel and the baffles can be made of aluminum, or both the baffles and the housing can be made of aluminum. Of course, these materials are strictly exemplary and other materials can also be used.

In use, the trap 132 is positioned along the outlet line of a chemical vapor deposition system such as the system 20 shown in FIG. 1. Most likely, the trap 132 will be connected either directly to a chemical vapor deposition chamber or connected to a short segment of outlet conduit connected to a chemical vapor deposition chamber. The trap 132 is connected to the outlet line such that the inlet fitting 140 is located upstream from the outlet fitting 142. As previously discussed, the inlet and outlet fittings 140 and 142 can be quick connect couplings adapted for allowing the trap 132 to quickly be connected to or disconnected from the outlet line.

When the trap 132 is incorporated within a chemical vapor deposition system, fluid containing waste by-product is evacuated from the chemical vapor deposition chamber and enters the trap 132 through the inlet fitting 140. Referring to FIG. 5, when the fluid enters the trap 132, the fluid flows in a generally downward direction. As the fluid flows downward, the baffles 134 disrupt flow and push the flow generally toward the left side of the trap 132. As the disrupted fluid flows past the baffles 134, waste by-product within the fluid becomes deposited on the baffles 134 and accumulates within the pockets 158 defined by the baffles 134. Because the baffles 134 are cooled by a cooling structure, the waste by-product deposition process is enhanced within the trap 132. As the fluid continues to flow downward and around the transverse fin 156 of the trap 132, a significant amount of waste by-product is retained on the baffles 134 within the trap 132 thereby reducing the amount of waste by-product that exists the trap 132.

With regard to the foregoing description, it is to be understood that changes may be made in detail, especially in matters of the construction materials employed in the size, shape, and arrangement of the parts without departing from the scope of the present invention. It is intended that the specification and the depicted embodiments be considered exemplary only, with a true scope and spirit of the invention being indicated by the broad meaning of the following claims.

We claim:

1. A chemical vapor deposition system comprising:
   a chemical vapor deposition chamber;
   an inlet line for directing reactant gases into the deposition chamber;
   an outlet line for discharging waste by-product from the deposition chamber;
   a detachable trap positioned along the outlet line for trapping at least a portion of the waste by-product, the trap including a chamber having a width and an array of baffles for increasing the surface area within the trap and disrupting flow within the trap;
   a cooling wall for cooling the trap, the cooling wall including structure defining a circulation path arranged and configured to circulate cooling fluid along at least a portion of the cooling wall; and
   wherein at least some of the baffles are connected to the cooling wall and comprise first baffle plates aligned at oblique angles with respect to the cooling wall at locations where the baffles connect to the cooling wall.

2. The chemical vapor deposition system of claim 1, further comprising means for cooling at least a portion of the trap to enhance waste by-product deposition within the trap.

3. The chemical vapor deposition system of claim 2, wherein means for cooling is arranged and configured to cool the baffles.

4. The chemical vapor deposition system of claim 2, wherein the means for cooling includes means for circulating cooling fluid adjacent the trap.

5. The chemical vapor deposition system of claim 4, wherein the cooling fluid comprises water.

6. The chemical vapor deposition system of claim 5, wherein the water is cooled below ambient temperature.

7. The chemical vapor deposition system of claim 5, wherein the water has a temperature less than 15 degrees Celsius.

8. The chemical vapor deposition system of claim 1, wherein at least some of the baffles have fixed ends connected to the cooling wall, and free ends distally located from the cooling wall.

9. The chemical vapor deposition system of claim 1, wherein at least one of the baffles comprises a second baffle plate aligned at a right angle with respect to the cooling wall.

10. The chemical vapor deposition system of claim 9, wherein the second baffle plate has substantially the same width as the width of the trap chamber.

11. The chemical vapor deposition system of claim 1, wherein the first baffle plates have varying lengths.

12. The chemical vapor deposition system of claim 1, wherein the free ends of the first baffle plates are aligned substantially along a common plane.

13. The chemical vapor deposition system of claim 1, wherein the common plane is oriented at an oblique angle with respect to the cooling wall.

14. The chemical vapor deposition system of claim 1, wherein the first baffle plates are substantially parallel.

15. The chemical vapor deposition system of claim 1, wherein the trap is detachably connected to the outlet line by vacuum fittings.

16. The chemical vapor deposition system of claim 1, wherein the baffles define pockets thereinbetween for accumulating waste by-product.

17. The chemical vapor deposition system of claim 1, further comprising cooling structure constructed and arranged to cool at least a portion of the trap to induce waste by-product deposition within the trap.

18. The chemical vapor deposition system of claim 1, wherein the first baffle plates have widths that are less than the width of the trap chamber.

19. The chemical vapor deposition system of claim 1, wherein the first baffle plates point in a generally vertical direction toward the outline line of the chemical vapor deposition chamber.

20. The chemical vapor deposition system of claim 1, wherein the waste by-product from the deposition chamber flow in a generally downward vertical direction.

21. A chemical vapor deposition system comprising:
    a chemical vapor deposition chamber;
    an inlet line for directing reactant gases into the deposition chamber;
    an outlet line for discharging waste by-product from the deposition chamber; and
    a detachable trap positioned along the outlet line for trapping at least a portion of the waste by-product, the trap including a chamber having a width and an array of baffles for increasing the surface area within the trap and disrupting flow within the trap;
    a cooling wall for cooling the trap, the cooling wall including structure defining a circulation path arranged and configured to circulate cooling fluuid along at least a portion of the cooling wall;
    wherein at least some of the baffles have fixed ends connected to the cooling wall; and free ends distally located from the cooling wall and comprise first baffle plates aligned at oblique angles with respect to the cooling wall; and
    wherein at least one of the baffles comprises a second baffle plate aligned at a right angle with respect to the cooling wall.

* * * * *

UNITED STATES PATENT AND TRADEMARK OFFICE
CERTIFICATE OF CORRECTION

PATENT NO. : 6,063,197

DATED : May 16, 2000

INVENTOR(S) :
Cox et al.

It is certified that error appears in the above-indentified patent and that said Letters Patent is hereby corrected as shown below:

Claim 21, col. 6, line 55, please delete "fluuid" and substitute --fluid--.

Claim 21, col. 6, line 58, please delete ";" and substitute --,--.

Signed and Sealed this

Tenth Day of April, 2001

Attest:

NICHOLAS P. GODICI

*Attesting Officer*  *Acting Director of the United States Patent and Trademark Office*